(12) United States Patent
Lung

(10) Patent No.: US 9,472,274 B1
(45) Date of Patent: Oct. 18, 2016

(54) REFRESH OF NONVOLATILE MEMORY CELLS AND REFERENCE CELLS WITH RESISTANCE DRIFT

(71) Applicant: MACRONIX INTERNATIONAL CO., LTD., Hsinchu (TW)

(72) Inventor: Hsiang-Lan Lung, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/788,969

(22) Filed: Jul. 1, 2015

(51) Int. Cl.
*G11C 11/00* (2006.01)
*G11C 13/00* (2006.01)

(52) U.S. Cl.
CPC ....... *G11C 13/0033* (2013.01); *G11C 13/0069* (2013.01)

(58) Field of Classification Search
CPC .................. G11C 13/0033; G11C 13/0069
See application file for complete search history.

(56) References Cited

U.S. PATENT DOCUMENTS

| | | |
|---|---|---|
| 6,800,504 B2 | 10/2004 | Li et al. |
| 2005/0029502 A1 | 2/2005 | Hudgens |
| 2006/0172067 A1 | 8/2006 | Ovshinsky et al. |
| 2008/0170431 A1* | 7/2008 | Sheu et al. .................. 365/163 |
| 2011/0013446 A1* | 1/2011 | Lung .......................... 365/163 |
| 2012/0278579 A1* | 11/2012 | Goss et al. ................... 711/166 |

OTHER PUBLICATIONS

Noboru Yamada "Potential of Ge—Sb—Te Phase-Change Optical Disks for High-Data-Rate Recording," SPIE v. 3109, pp. 28-37 (1997).

* cited by examiner

*Primary Examiner* — Richard Elms
*Assistant Examiner* — Mohammed A Bashar
(74) *Attorney, Agent, or Firm* — Haynes Beffel & Wolfeld LLP

(57) ABSTRACT

Resistance drift can be addressed by refreshing the nonvolatile memory cells and reference cells. Different approaches include performing the refresh upon a program operation, and upon satisfaction of a condition after the program operation. Refreshes are performed on a reference resistance stored in a reference cell that can be compared by a sense amplifier to the resistance stored in a memory cell. In one approach, upon programming the first memory cell, a stored refresh status is updated to indicate that the first resistance of the first memory cell and the first reference resistance of the first reference cell are to be refreshed upon satisfaction of a condition. In another approach, upon programming the first memory cell, the first reference cell is programmed.

14 Claims, 13 Drawing Sheets

US 9,472,274 B1

REFRESH OF NONVOLATILE MEMORY CELLS AND REFERENCE CELLS WITH RESISTANCE DRIFT

BACKGROUND

1. Field of the Invention

The present technology relates to nonvolatile memory with resistive memory cells such as phase change memory.

2. Description of Related Art

Resistive memory cells such as phase change memory suffer from the problem of resistance drift. In resistance drift, the mere passage of time since the last program operation results in continued change of the resistance value stored by the memory cell.

FIG. 1 is a graph showing an example of resistance drift with constant reference thresholds. The reference thresholds include reference 1 11, reference 2 13, and reference 3 15. The reference thresholds define the outer bounds of resistance windows and define resistance ranges representing different data values stored in memory cells.

Because of resistance drift, the resistance windows of the acceptable resistance ranges to store respective data values narrow with the passage of time. If not addressed, the resistance windows for data values can narrow unacceptably or even disappear entirely, and particular memory cells can store resistance values that drift outside the resistance range that represents the data value that was stored in the particular memory cells. For example, in FIG. 1, the resistance values R2 and R3 have drifted over time to different resistance ranges. When programmed, resistance value R2 was between reference 1 11 and reference 2 13, but as a result of resistance drift, resistance value R2 later is between reference 2 13 and reference 3 15. When programmed, resistance value R3 was between reference 2 13 and reference 3 15, but as a result of resistance drift, resistance value R3 later is over reference 3 15. In either case, because the resistance values R2 and R3 have suffered resistance drift, the memory cells storing resistance values R2 and R3 store resistances the represent different data values than the initial data values represented by the initially programmed resistances.

One approach to address resistance drift is to perform numerous updates of the thresholds between resistance ranges. In this approach, as the memory cells undergo resistance drift with time, the thresholds are artificially changed with time. This approach heavily relies on accurate resistance drift models, which can diverge from the actual resistance drift experienced by some, if not many, of the memory cells. As time passes, such divergence between modeled and actual resistance drift worsens.

For example, FIG. 2 is a graph showing an example of resistance drift with reference thresholds that are adjusted with time. The reference thresholds include reference 1 117, reference 2 19, and reference 3 21. Again, the reference thresholds define the outer bounds of resistance windows that define resistance ranges representing different data values. However, in an attempt to compensate for resistance drift experienced by the stored resistance values, the reference thresholds undergo numerous updates. Ideally, the updated reference thresholds result in the stored resistance values staying in the correct respective resistance ranges despite resistance drift. However, the heavy reliance on models can prove misplaced, and such divergence between modeled and actual resistance drift worsens with time.

It is therefore desirable to address resistance drift in a way that accurately reflects the underlying resistances of the memory cells. It is also desirable to address resistance drift in a way that does not become less accurate over the lifetime of the memory device.

SUMMARY

Resistance drift can be addressed by refreshing the nonvolatile memory cells and reference cells. Different approaches include performing the refresh upon a program operation, and upon satisfaction of a condition after the program operation.

In one aspect of the technology, an integrated circuit includes a first memory cell storing a first resistance, sense amplifier circuitry including a first reference cell having a first reference resistance, a memory storing a refresh status of the first reference cell, and control circuitry.

The sense amplifier circuitry can compare the first resistance of the first memory cell and the first reference resistance of the first reference cell, to compare the first resistance with respect to the first reference resistance. The control circuitry can be responsive to a program instruction of the first memory cell. The control circuitry, upon programming the first memory cell, updates the refresh status stored in the memory to indicate that the first resistance of the first memory cell and the first reference resistance of the first reference cell are to be refreshed upon satisfaction of a condition. In various embodiments, the condition is passage of a time period, the condition is receipt by the control circuitry of a signal caused by an upcoming power off of the integrated circuit, and the condition is receipt by the control circuitry of a signal caused by a backup power supply providing power to the integrated circuit.

In one embodiment of the technology, the control circuitry, upon satisfaction of the condition, refreshes the first resistance of the first memory cell and the first reference resistance stored in the first reference cell, and updates the refresh status stored in the memory to indicate that the first resistance of the first memory cell and the first reference resistance of the first reference cell have been refreshed.

In one embodiment of the technology, the first memory cell and the first reference cell share a same cell structure. For example, in embodiments with the first memory cell and the first reference cell both being phase change cells, both the first memory cell and the first reference cell can be the mushroom-type, bridge-type, active-in-via type, or pore-type.

In one embodiment of the technology, the first memory cell and the first reference cell share a same programmable resistance material. Examples are phase change material, metal oxide material, spin transfer torque material, conductive bridge material, magnetic material, and magnetoresistive material In one embodiment of the technology, the first resistance stores multiple bits, the first reference cell is one of a plurality of reference cells storing different reference resistances, the sense amplifier circuitry compares the first resistance to the different reference resistances to determine the multiple bits represented by the first resistance, and the plurality of reference cells are to be refreshed upon satisfaction of the condition.

In one aspect of the technology, an integrated circuit includes a first memory cell storing a first resistance, sense amplifier circuitry including a first reference cell storing a first reference resistance, and control circuitry.

The sense amplifier circuitry compares the first resistance stored on the first memory cell and the first reference resistance stored on the first reference cell, to compare the first resistance with respect to the first reference resistance. The control circuitry is responsive to a program instruction of the first memory cell, by programming the first memory cell and the first reference cell.

In one embodiment of the technology, the first memory cell and the first reference cell share a same cell structure. For example, in embodiments with the first memory cell and the first reference cell both being phase change cells, both the first memory cell and the first reference cell can be the mushroom-type, bridge-type, active-in-via type, or pore-type.

In one embodiment of the technology, the first memory cell and the first reference cell share a same programmable resistance material. Examples are phase change material, metal oxide material, spin transfer torque material, conductive bridge material, magnetic material, and magnetoresistive material.

In one embodiment of the technology, the first resistance stores multiple bits, the first reference cell is one of a plurality of reference cells storing different reference resistances, the sense amplifier circuitry compares the first resistance to the different reference resistances to determine the multiple bits represented by the first resistance, and the control circuitry programs the first memory cell, upon receiving a program instruction of the first memory cell.

In one aspect of the technology, an integrated circuit includes an array of memory cells including a plurality of groups of memory cells storing resistances, a plurality of sense amplifiers including a plurality of sets of reference cells storing the reference resistances, and control circuitry.

The plurality of sense amplifiers can compare the resistances stored on the array of memory cells with reference resistances, to determine relative value of the resistances with respect to reference resistances. Different sets of reference cells in the plurality of sets of reference cells are coupled to different groups of memory cells in the plurality of groups of memory cells via a respective sense amplifier in the plurality of sense amplifiers. The control circuitry, upon programming one or more memory cells in a first group of memory cells in the plurality of groups, programs a set of reference cells in the plurality of sets of reference cells coupled to the first group of memory cells via the respective sense amplifier.

In one embodiment of the technology, the control circuitry, upon programming the one or more memory cells in the first group of memory cells, also programs one or more other programmed memory cells in the first group of memory cells.

In one aspect of the technology, an integrated circuit includes an array of memory cells including a plurality of groups of memory cells storing resistances, a plurality of sense amplifiers including a plurality of sets of reference cells storing the reference resistances, a memory storing refresh statuses of the plurality of groups of memory cells, and control circuitry.

The plurality of sense amplifiers can compare the resistances stored on the array of memory cells with reference resistances, to determine relative value of the resistances with respect to reference resistances. Different sets of reference cells in the plurality of sets of reference cells are coupled to different groups of memory cells in the plurality of groups of memory cells via a respective sense amplifier in the plurality of sense amplifiers. The control circuitry upon programming one or more memory cells in a first group of memory cells in the plurality of groups of memory cells, updates a respective one of the refresh statuses stored in the memory to indicate that the resistances of the first group of memory cells and the reference resistances of the set of reference cells in the plurality of sets of reference cells are to be refreshed upon satisfaction of a condition, the set of reference cells in the plurality of sets of reference cells coupled to the first group of memory cells via the respective sense amplifier In one embodiment of the technology, the control circuitry, upon satisfaction of the condition, refreshes the resistances of the first group of memory cells and the reference resistances of the set of reference cells, and updates the refresh statuses stored in the memory to indicate that resistances of the first group of memory cells and the reference resistances of the set of reference cells have been refreshed. The set of reference cells in the plurality of sets of reference cells is coupled to the first group of memory cells via the respective sense amplifier.

One aspect of the technology is method, comprising:
programming a first memory cell to have a first resistance;
upon programming the first memory cell, updating a refresh status of the first memory cell stored in a memory to indicate that the first resistance of the first memory cell and a first reference resistance of a first reference cell are to be refreshed upon satisfaction of a condition, wherein the first memory cell and the first reference cell are electrically coupleable via sense amplifier circuitry. The sense amplifier circuitry can compare the first resistance with respect to the first reference resistance.

One aspect of the technology is method, comprising:
programming a first memory cell to have a first resistance;
upon programming the first memory cell, programming a first reference cell to have a first reference resistance, wherein the first memory cell and the first reference cell are electrically coupleable via sense amplifier circuitry. The sense amplifier circuitry can compare the first resistance with respect to the first reference resistance.

One aspect of the technology is method, comprising:
programming one or more memory cells in a first group of memory cells in the plurality of groups of memory cells, the one or more memory cells having respective resistances;
upon programming the one or more memory cells in the first group of memory cells, programming a set of reference cells in a plurality of sets of reference cells having reference resistances, wherein different sets of reference cells in the plurality of sets of reference cells are electrically coupleable to different groups of memory cells in the plurality of groups of memory cells via a respective sense amplifier in a plurality of sense amplifiers. The respective sense amplifier can compare the respective resistances with the reference resistances.

In one embodiment of the technology, upon programming the one or more memory cells in the first group of memory cells, also programming one or more other programmed memory cells in the first group of memory cells.

One aspect of the technology is method, comprising:
programming one or more memory cells in a first group of memory cells in the plurality of groups of memory cells to have respective resistances;
upon programming the one or more memory cells in the first group of memory cells, updating a respective one of a plurality of refresh statuses stored in a memory to indicate that the resistances of the first group of memory cells and reference resistances of a set of reference cells in a plurality of sets of reference cells are to be refreshed upon satisfaction of a condition, the set of reference cells coupled to the first group of memory cells via a respective sense amplifier in a plurality of sense amplifiers.

Other aspects and advantages of the present invention can be seen on review of the drawings, the detailed description and the claims, which follow.

BRIEF DESCRIPTION OF THE DRAWINGS

FIG. 12 is a cross-sectional view of a mushroom-type cell which can be used as the memory cells and the reference cells.

FIG. 13 is a cross-sectional view of a bridge-type cell which can be used as the memory cells and the reference cells.

FIG. 14 shows a cross-sectional view of an active-in-via type cell which can be used as the memory cells and the reference cells.

FIG. 15 shows a cross-sectional view of a pore-type cell which can be used as the memory cells and the reference cells.

FIG. 16 illustrates a cross-sectional view of a metal-oxide cell which can be used as the memory cells and the reference cells.

DETAILED DESCRIPTION

Figure 1:
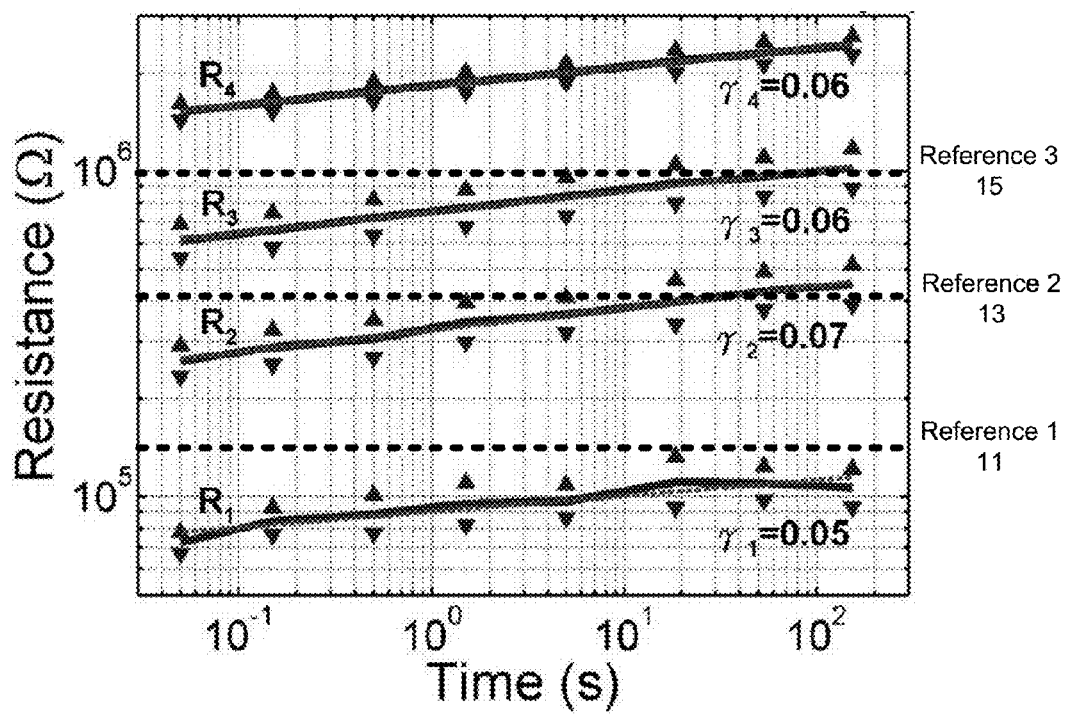
FIG. 1 is a graph showing an example of resistance drift with constant reference thresholds.
Figure 2:
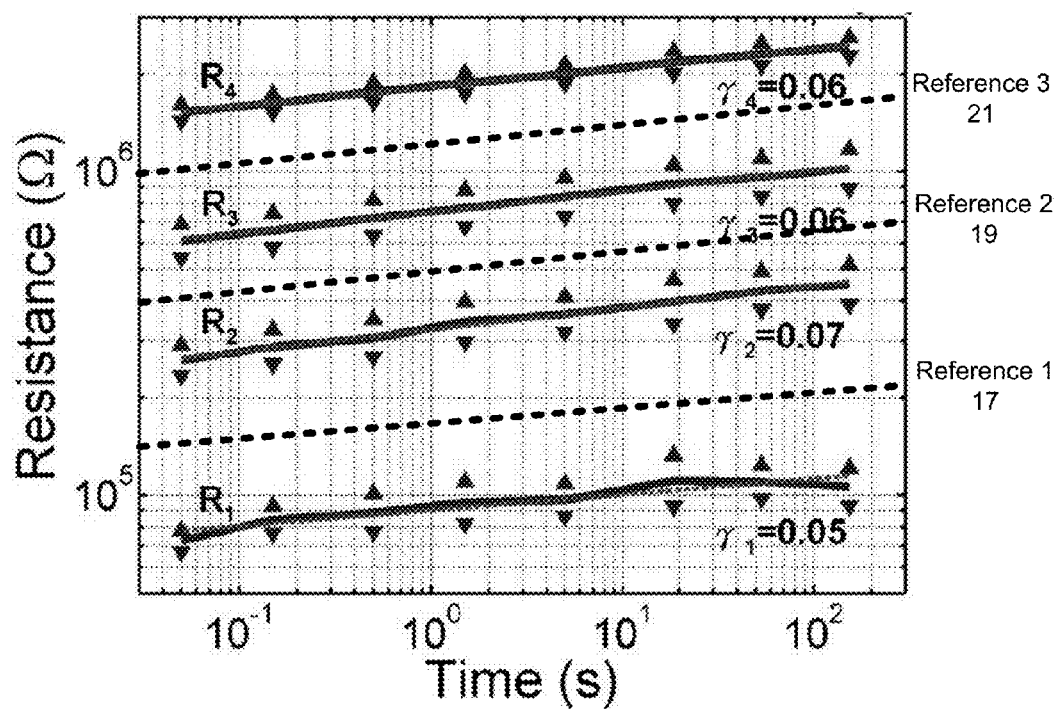
FIG. 2 is a graph showing an example of resistance drift with reference thresholds that are adjusted with time.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Figure 3:
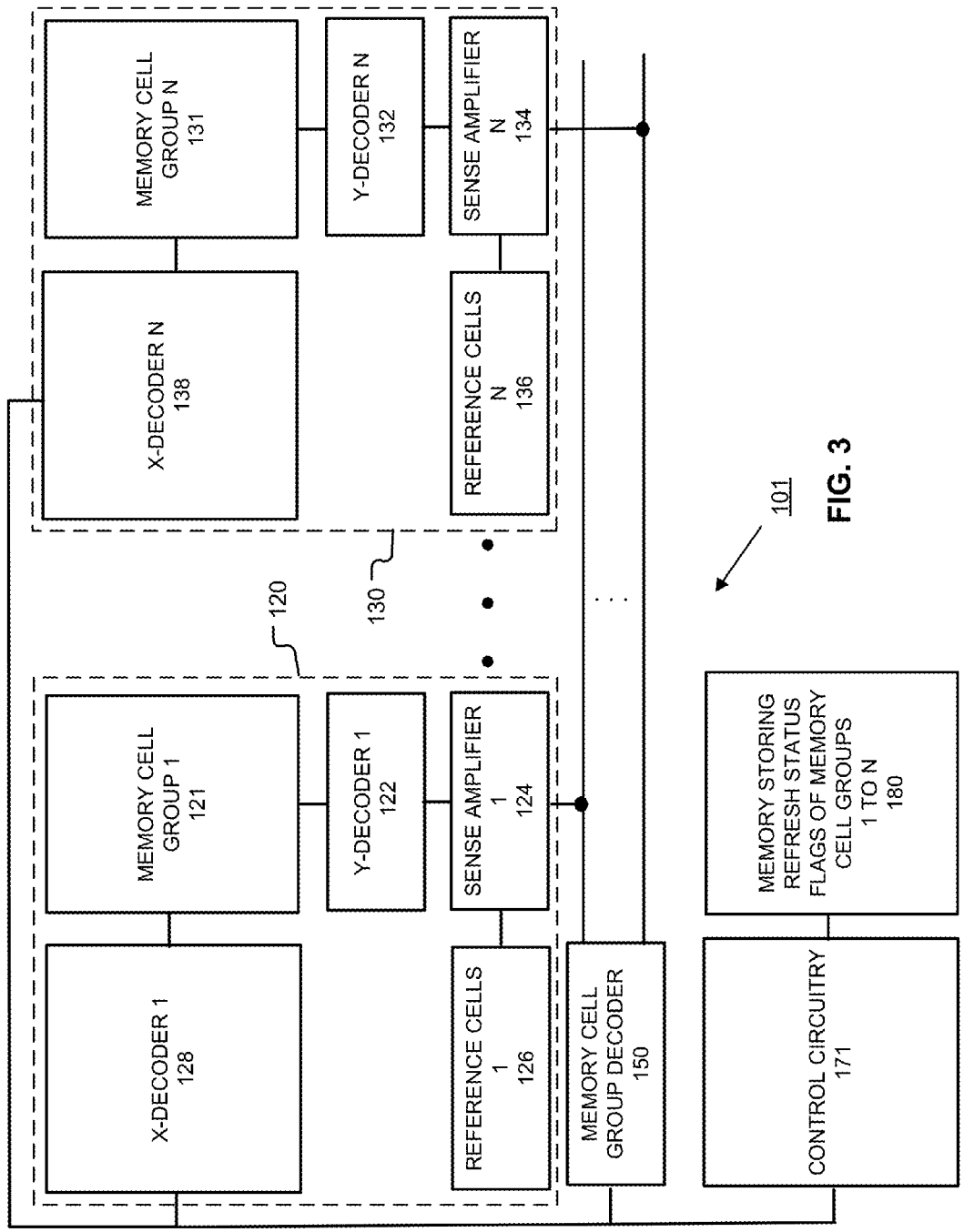
FIG. 3 is a block diagram of an example system that refreshes the resistive memory cells and the reference cells, including a refresh status memory that can store flags that indicate the refresh status of the resistive memory cells and the reference cells.

FIG. 3 is a block diagram of an example system that refreshes the resistive memory cells and the reference cells, including a refresh status memory that can store flags that indicate the refresh status of the resistive memory cells and the reference cells.

Integrated circuit 101 includes N groups, including group 1 120 through group N 130. Group 1 120 includes memory cell group 1 121, Y-decoder 1 122, sense amplifier 1 124, reference cells 1 126, and X-decoder 1 128. Group N 130 includes memory cell group N 131, Y-decoder N 132, sense amplifier N 134, reference cells N 136, and X-decoder N 138. Other groups of the N groups can include similar parts. In another embodiment, an X-decoder can be shared among multiple groups.

Examples of various cell structures and materials in memory cell group 1 121 to memory cell group N 131 are discussed in connection with subsequent figures. Memory cells selected for memory operations such as read, program, and erase are addressed via X-decoder 1 128 and Y-decoder 1 122 in group 1 120, and via X-decoder N 138 and Y-decoder N 132 in group N 130. When performing a read operation, or a verify step of a program or erase operation, sense amplifier 1 124 compares a selected memory cell in memory cell group 1 121 with reference cells 1 126. Similarly, sense amplifier N 134 compares a selected memory cell in memory cell group N 131 with reference cells N 136. By comparing memory cells with reference cells, the sense amplifier determines relative value of the resistance stored in the memory cell with respect to the reference cell.

An example number of reference cells is the total number of the possible data values which can be stored in a memory cell, less 1. The reference resistances stored by reference cells demarcate the resistance ranges representing different data values. For example, a basic 2 level memory cell with 2 possible data values can be compared to 2−1=1 reference cell storing a reference resistance that demarcates the 2 resistance ranges representing 2 different data values, and an N level memory cell with N possible data values can be compared to N−1 reference cells storing N−1 different reference resistances that demarcate the N resistance ranges representing N different data values. In such cases, by comparing memory cells with reference cells, the sense amplifier determines relative value of the resistance stored in the memory cell with respect to the N−1 reference cells to determine the particular one of the N resistance ranges which encompasses the stored resistance.

In various embodiments, the cell structure and/or materials are the same between the memory cells of a memory cell group and the reference cells that correspond to each other. Memory cells and reference cells correspond to each other when a sense amplifier can electrically couple memory cells and reference cells to each other for comparison, and decouple the memory cells and reference cells from each other. For example, memory cells in memory group 1 121 and reference cells in reference cells 1 126 correspond to each other via sense amplifier 1 124, and memory cells in memory group N 121 and reference cells in reference cells N 136 correspond to each other via sense amplifier N 134.

By sharing the cell structure and/or materials as each other, the resistance drift experienced by memory cells and the resistance drift experienced by reference cells closely track each other. However, such tracking of resistance drift between memory cells and reference cells is subject to divergence with the passage of time without refresh.

Memory cell group decoder 150 selects one of the N groups, including group 1 120 through group N 130, responsive to the control circuitry 171.

Memory 180 stores refresh status flags for group 1 120 to group N 130. A memory flag for a particular group is set, when one or more of the memory cells in the particular group is programmed. A set memory flag for a particular group indicates that the programmed memory cells and reference cells in the particular group are to be refreshed upon satisfaction of some condition, such as passage of a time period, receipt by the control circuitry of a signal caused by an upcoming power off of the integrated circuit, and receipt by the control circuitry of a signal caused by a backup power supply providing power to the integrated circuit. After refresh of the programmed memory cells and reference cells in the particular group, the status flag for the particular group is reset. Example process flows performed by control circuitry 171 are discussed in examples of FIGS. 10 and 11. The control circuitry can perform refresh or programming, such as shown in examples of FIGS. 10 and 11.

The location of the memory 180 is exemplary. For example, the memory 180 can be part of the different groups, group 1 120 to group N 130, in a shown component or in an additional component. In another embodiment, flags in memory 180 can indicate that a differently-sized group of programmed memory cells and reference cells in the differently-sized group are to be refreshed upon satisfaction of some condition passage of a time period, receipt by the control circuitry of a signal caused by an upcoming power off of the integrated circuit, and receipt by the control circuitry of a signal caused by a backup power supply providing power to the integrated circuit. For example, rather than the programmed cells of an entire memory cell group such as memory cell group 1 121 or memory cell group N 131, the memory cell group can be divided into smaller sub-groups, with different sub-groups represented by different flags in memory 180. In another example, parts of a memory group holding unimportant data can remain unrepresented by a flag in memory 180.

Figure 4:
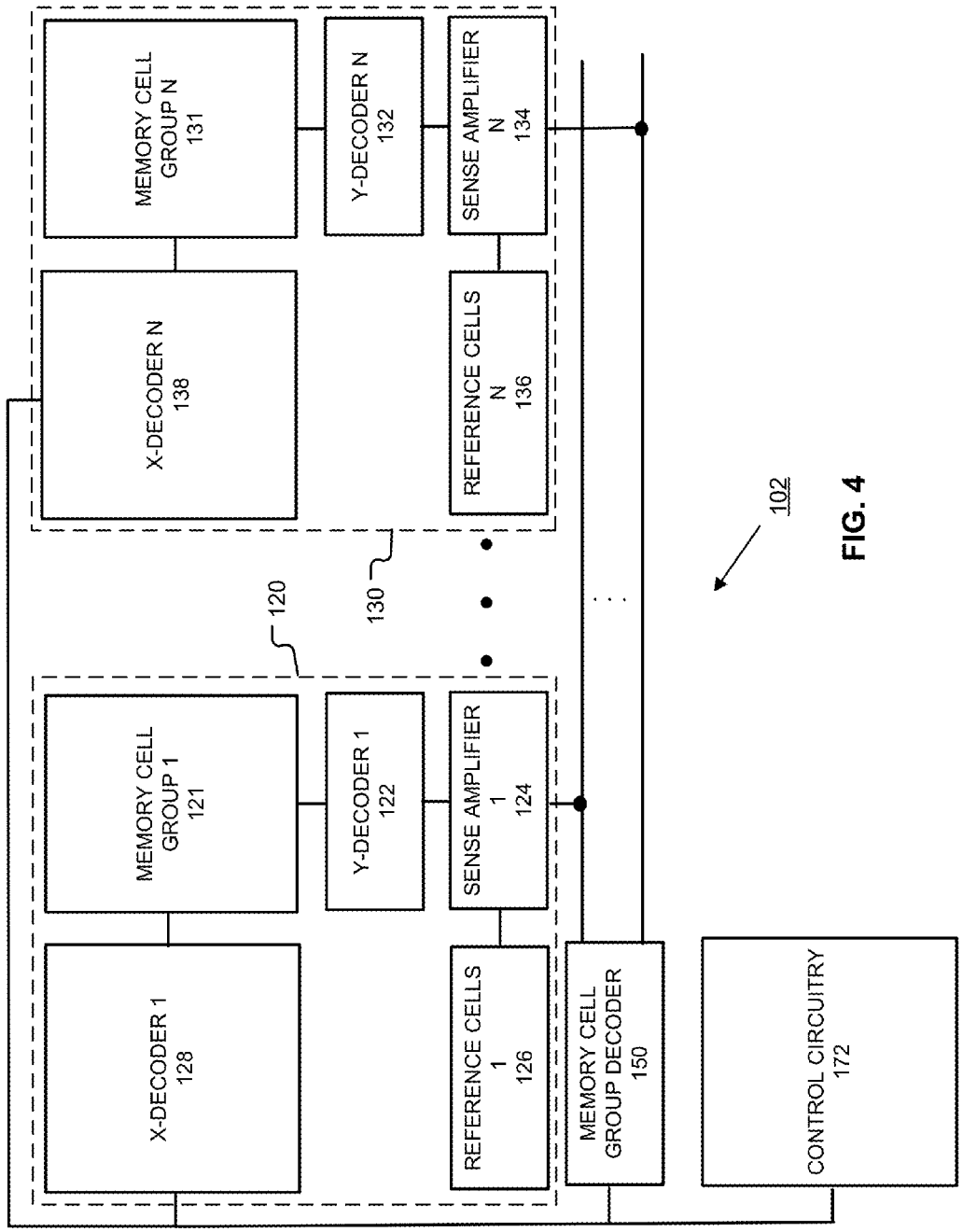
FIG. 4 is a block diagram of an example system that refreshes the resistive memory cells and the reference cells, without requiring a memory to store refresh status flags.

FIG. 4 is a block diagram of an example system that refreshes the resistive memory cells and the reference cells, without requiring memory to store refresh status flags.

FIG. 4 shares many of the same parts as FIG. 3, such as memory cell group 1 121 to memory cell group N 131, and memory cell group decoder 150. However, in the integrated circuit 102 of FIG. 4, memory 180 that stores refresh status flags is not required.

Refresh occurs more frequently in the example of FIG. 4 than the example of FIG. 3. However, cycling endurance is not affected, in that memories such as flash perform block erasing before performing programming. In some embodiments the cycling endurance of reference cells is equal to the cycling endurance of memory cells. Cycling endurance refers to a number of viable program and erase cycles in the lifetime of the cell.

In another embodiment, the memory 180 is not required, because all groups are refreshed upon satisfaction of a condition such as passage of a time period, receipt by the control circuitry of a signal caused by an upcoming power off of the integrated circuit, and receipt by the control circuitry of a signal caused by a backup power supply providing power to the integrated circuit. Alternatively, rather than all groups, a predetermined subset of all the groups are refreshed upon satisfaction of a condition. In yet another alternative, a predetermined sub-group of each of the groups is refreshed upon satisfaction of a condition. In a further alternative, a predetermined sub-group of a predetermined subset of the groups is refreshed upon satisfaction of a condition. Several such alternatives share the feature that, because the identification of the parts that undergo refresh is predetermined, a memory 180 is not required to keep track of memory cell groups with memory cells that have been programmed since the last refresh.

Figure 8:
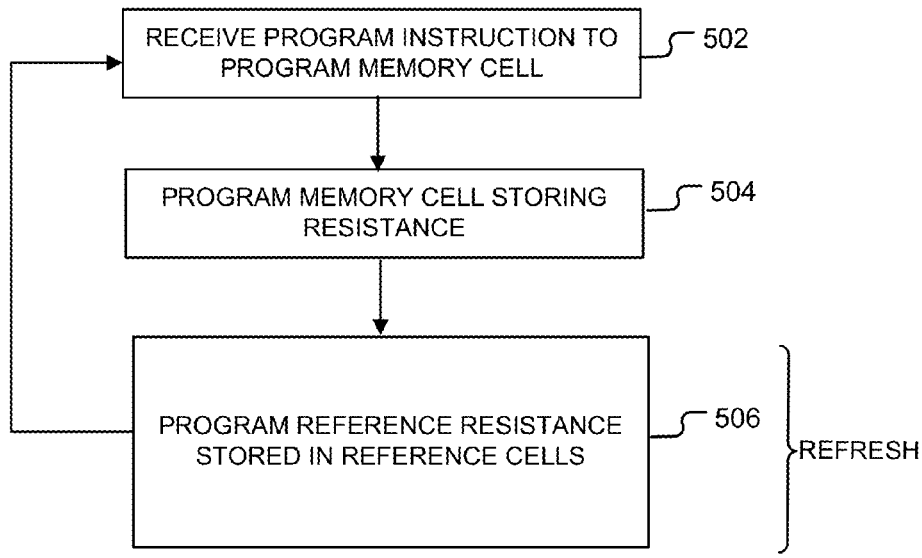
FIG. 8 is an example process flow of an integrated circuit performing refresh to counter resistance drift.
Figure 9:
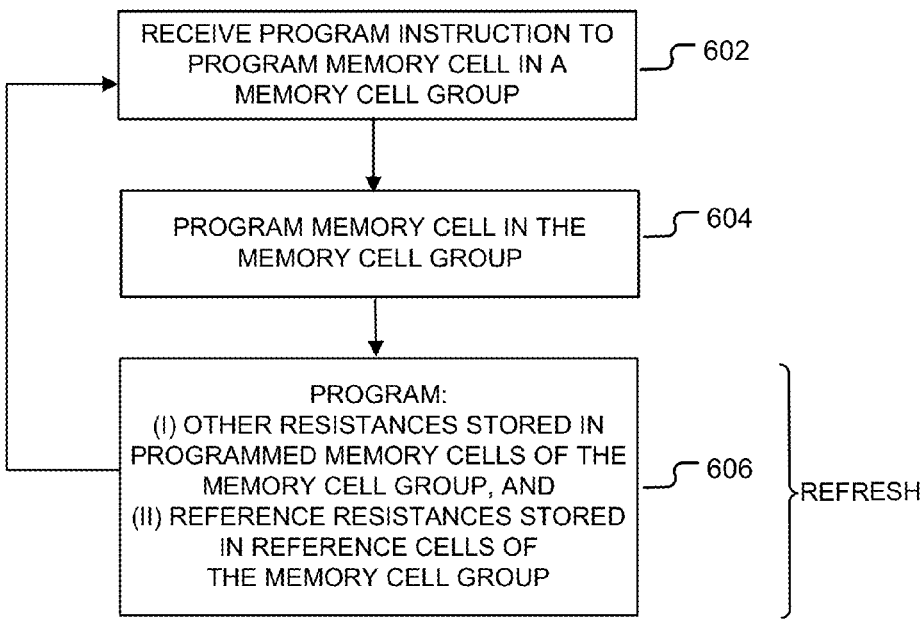
FIG. 9 is an example process flow of an integrated circuit performing refresh to counter resistance drift, with a group of memory cells that includes a memory cell is selected for program.

Example process flows performed by control circuitry 172 are discussed in examples of FIGS. 8 and 9. The control circuitry can perform refresh or programming, such as shown in examples of FIGS. 8 and 9. Otherwise, control circuitry 172 can perform similarly to control circuitry 171 in FIG. 3.

Figure 5:
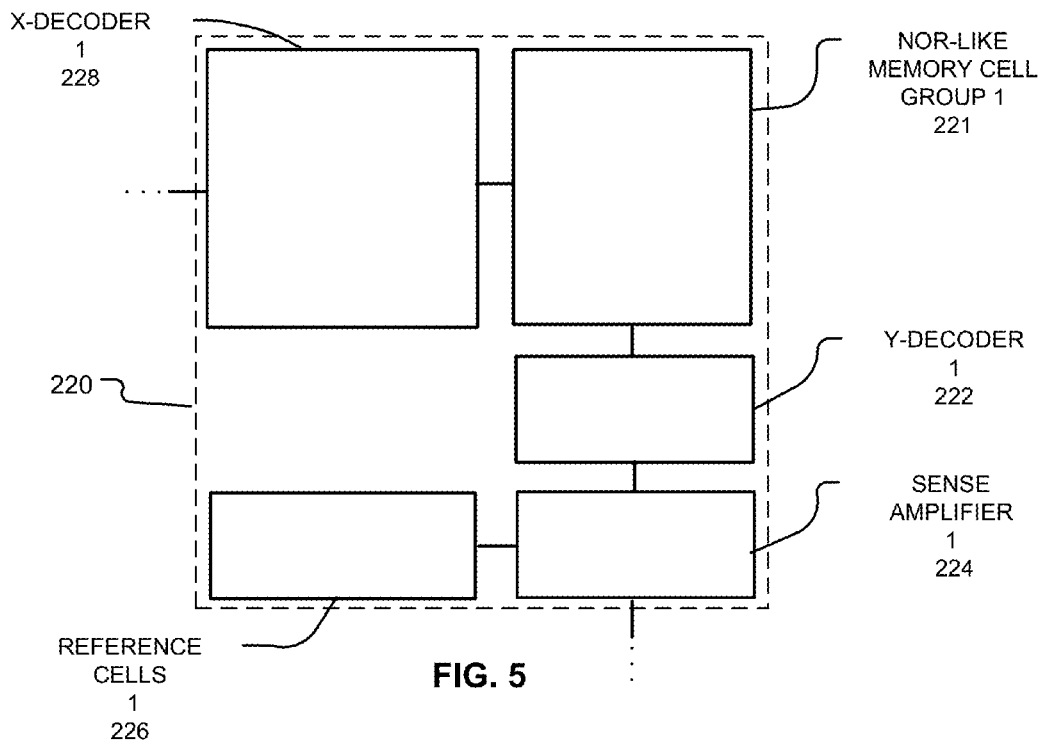
FIGS. 5 and 6 are examples of different sizes of memory cell groups, contrasting NOR-like groups and DRAM-like groups.
Figure 6:
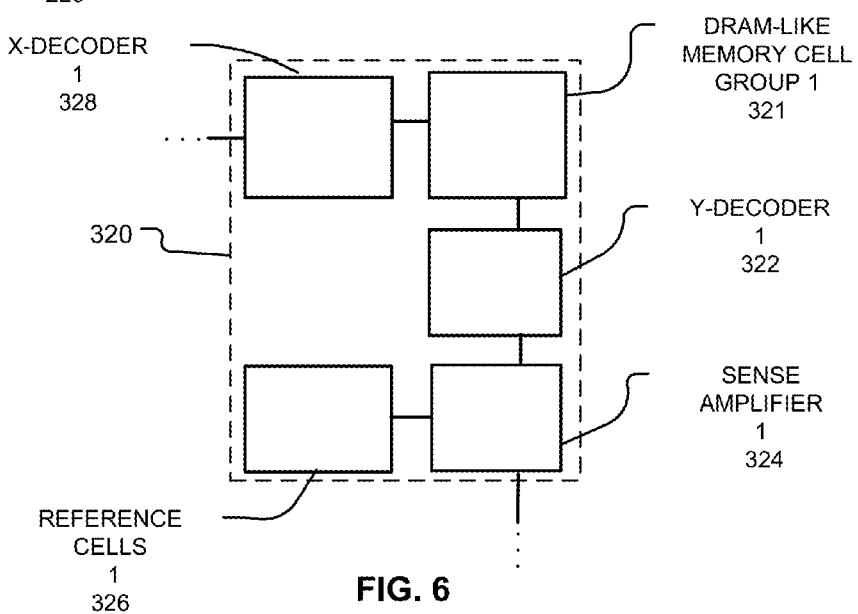

FIGS. 5 and 6 are examples of different sizes of memory cell groups, contrasting NOR-like groups and DRAM-like groups. The example groups of FIGS. 5 and 6 can be used in the integrated circuit of FIG. 3 or the integrated circuit of FIG. 4.

FIG. 5 shows a group 220 including NOR-like memory cell group 1 221, Y-decoder 1 222, sense amplifier 1 224, reference cells 1 226, and X-decoder 1 228.

FIG. 6 shows a group 320 including DRAM-like memory cell group 1 321, Y-decoder 1 322, sense amplifier 1 324, reference cells 1 326, and X-decoder 1 328.

The DRAM-like memory cell group 1 321 is smaller than the NOR-like memory cell group 1 221, in both the X-direction and the Y-direction. Word lines extend from the X-decoder along the length of the Y-decoder, and bit lines extend from the Y-decoder along the length of the X-decoder. So the X-direction dimension is indicative of the bit line length, and the Y-direction dimension is indicative of the word line length. DRAM-like memory cell group 1 321 has shorter bit lines and shorter word lines, and NOR-like memory cell group 1 221 has longer bit lines and longer word lines.

For higher read and write performance, DRAM-like memory cell group 1 321 is adopted over NOR-like memory cell group 1 221. DRAM-like memory cell group 1 321 has smaller memory capacity than NOR-like memory cell group 1 221. So to add up to a same total memory capacity, more DRAM-like memory cell groups are required than NOR-like memory cell groups. The larger number of groups required for DRAM-like memory performance is accompanied by more overhead such as more sense amplifiers, more discrete groups of reference cells for the sense amplifiers, and more wire routing to different groups. So the aggregate size of DRAM-like memory cell groups tends to be larger than the aggregate size of NOR-like memory cell groups, even if the memory capacities of DRAM-like memory cell groups and the memory capacities of NOR-like memory cell groups separately add up to a same total memory capacity.

An alternative can combine DRAM-like memory performance and NOR-like memory performance, by including multiple memory cell groups of different X-dimensions and Y-dimensions. In the same embodiment, the smaller dimensioned memory cell groups provide better memory performance, and the larger dimensioned memory cell groups add bulk memory capacity.

In some embodiments, resistance drift can be characterized by the following equations:

$$R(t) = R0\left(\frac{t}{t0}\right)^\gamma$$

$$\gamma = \frac{\Delta \log(R)}{\Delta \log(t)}$$

In the first equation, the resistance at an end time after a time period of resistance drift is equal to the initial resistance multiplied by a fraction. The fraction is the ratio of the end time over the beginning time. The fraction has an exponent of gamma, the drift coefficient.

In the second equation, gamma, the drift coefficient, is equal to a fraction. The numerator is the difference of 2 logarithms: the logarithm of the end resistance, and the logarithm of the initial resistance. The denominator is the difference of 2 logarithms: the logarithm of the end time, and the logarithm of the beginning time.

The following example tables show calculations of decreasing resistance windows as result of resistance drift, at the conclusion of the passage of 1 hour since programming, and at the conclusion of the passage of 24 hours since programming. At the conclusion of the passage of the respective time period, a refresh can be initiated of programmed memory cells and reference cells. After refresh, the resistance drift process beings anew.

The table below is an example using the two resistance drift equations. Memory cells store resistance values R1, R2, and R3 in different resistance ranges. The different resistance ranges are demarcated by different reference resistances 150 kilohms, 300 kilohms, and 530 kilohms. The beginning time t0 is 5 seconds. The initial resistance R0 undergoes resistance drift for time periods of 3600 seconds (1 hour) and 86400 seconds (24 hours) to the end resistance. The drift coefficient gamma is 0.01. The resistance window is the difference between the reference resistance and the end resistance. In the table below, the smallest magnitude resistance window drops to about 62 kilohms prior to refresh at 24 hours.

|    | R (kΩ)   | R0 (kΩ) | t (sec) | Ref (kΩ) | R-window (kΩ) |
|----|----------|---------|---------|----------|---------------|
| R1 | 85.44041 | 80      | 3600    | 150      | 64.55959232   |
|    | 88.19936 | 80      | 86400   | 150      | 61.80064191   |
| R2 | 213.601  | 200     | 3600    | 300      | 86.39898079   |
|    | 220.4984 | 200     | 86400   | 300      | 79.50160477   |
| R3 | 405.8419 | 380     | 3600    | 530      | 124.1580635   |
|    | 418.947  | 380     | 86400   | 530      | 111.0530491   |

The table below is another example using the two resistance drift equations. Memory cells store resistance values R1, R2, and R3 in different resistance ranges. The different resistance ranges are demarcated by different reference resistances 150 kilohms, 300 kilohms, and 530 kilohms. The beginning time t0 is 5 seconds. The initial resistance R0 undergoes resistance drift for time periods of 3600 seconds (1 hour) and 86400 seconds (24 hours) to the end resistance. The drift coefficient gamma is 0.03. The resistance window is the difference between the reference resistance and the end resistance. In the table below, the smallest magnitude resistance window drops to about 21 kilohms prior to refresh at 24 hours.

|    | R (kΩ)   | R0 (kΩ) | t (sec) | Ref (kΩ) | R-window (kΩ) |
|----|----------|---------|---------|----------|---------------|
| R1 | 97.45631 | 80      | 3600    | 150      | 52.54369039   |
|    | 107.2053 | 80      | 86400   | 150      | 42.79468947   |
| R2 | 243.6408 | 200     | 3600    | 300      | 56.35922597   |
|    | 268.0133 | 200     | 86400   | 300      | 31.98672367   |
| R3 | 462.9175 | 380     | 3600    | 530      | 67.08252934   |
|    | 509.2252 | 380     | 86400   | 530      | 20.77477498   |

In the example tables above, the example refresh period of 24 hours amounts to refreshing a memory cell and refreshing a reference cell about 3600 times over a 10 year lifetime of the memory cell and the reference cell. Refresh periods longer or shorter than 24 hours or longer or shorter than 1 hour may be chosen. Similarly, different values can be chosen for quantity and values of reference resistances, quantity and values of initial resistances, and gamma which can be determined by design and fabrication variations.

Figure 7:
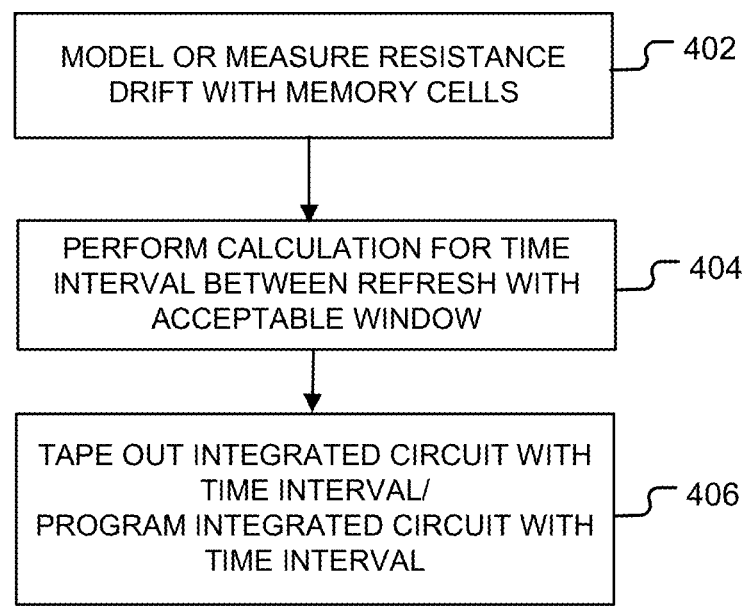
FIG. 7 is an example process flow of making an integrated circuit that performs refresh to counter resistance drift.

FIG. 7 is an example process flow of making an integrated circuit that performs refresh to counter resistance drift.

At 402, resistance drift is modeled or measured for example as shown in the example tables above. At 404, the minimum resistance window is identified. If the minimum resistance window is unacceptable, the time period can be decreased to lower the amount of resistance drift, until the minimum resistance window is acceptable. Alternatively, if the minimum resistance window is acceptable, the time period can be increased to raise the amount of resistance drift, such that the frequency of refresh is decreased while maintaining an acceptable minimum resistance window. At 406, the integrated circuit designed with an appropriate refresh period is taped out. Alternatively, after the integrated circuit is manufactured, an appropriate refresh period is programmed onto the integrated circuit. The process flow can be shortened to a subset or subcombination of the steps.

The following FIGS. 8-11 show example process flows of performing refresh. In the example process flows, refresh indicates instances of program that follow the successful programming of cells identified in a program command. The refresh can include an erase or block erase preceding the program.

FIG. 8 is an example process flow of an integrated circuit performing refresh to counter resistance drift.

At 502 a program instruction is received to program a memory cell. At 504 responsive to the program instruction, the memory cell is programmed. At 506, reference cells for the programmed memory cell are refreshed. By refreshing the reference cells, the refreshed reference cells will undergo subsequent resistance drift that tracks the memory cell programmed in response to the program instruction.

This process flow can be performed for example with the integrated circuit of FIG. 4. The programmed memory cell can be in any of memory cell group 1 121 to memory cell group N 131. The reference cells are in the same group as the programmed memory cell. For example, responsive to receiving a program instruction to program a memory cell in memory cell group 1 121, the memory cell in memory cell group 1 121 is programmed. To refresh, the reference cells in reference cells 1 126 are programmed.

FIG. 9 is an example process flow of an integrated circuit performing refresh to counter resistance drift, with a group of memory cells that includes a memory cell is selected for program.

At 602 a program instruction is received to program a memory cell in a memory cell group. At 604 responsive to the program instruction, the memory cell in the memory cell group is programmed. At 606, multiple sets of other cells are refreshed. In one set of refresh, reference cells for the programmed memory cell are refreshed. As in FIG. 8, by refreshing the reference cells, the refreshed reference cells will undergo subsequent resistance drift that tracks the memory cell programmed in response to the program instruction. In another set of refresh, other resistances stored by other programmed memory cells are refreshed. These other programmed memory cells are in the same memory cell group as the programmed memory cell and were previously programmed. By refreshing these other resistances in the same memory cell group as the programmed memory cell, the other programmed memory cells will undergo subsequent resistance drift that tracks the memory cell programmed in response to the program instruction.

This process flow can be performed for example with the integrated circuit of FIG. 4, as in the discussion for FIG. 8. For example, responsive to receiving a program instruction to program a memory cell in memory cell group 1 121, the memory cell in memory cell group 1 121 is programmed. To refresh, the reference cells in reference cells 1 126 are programmed, and other programmed memory cells in memory cell group 1 121 are programmed.

Figure 10:
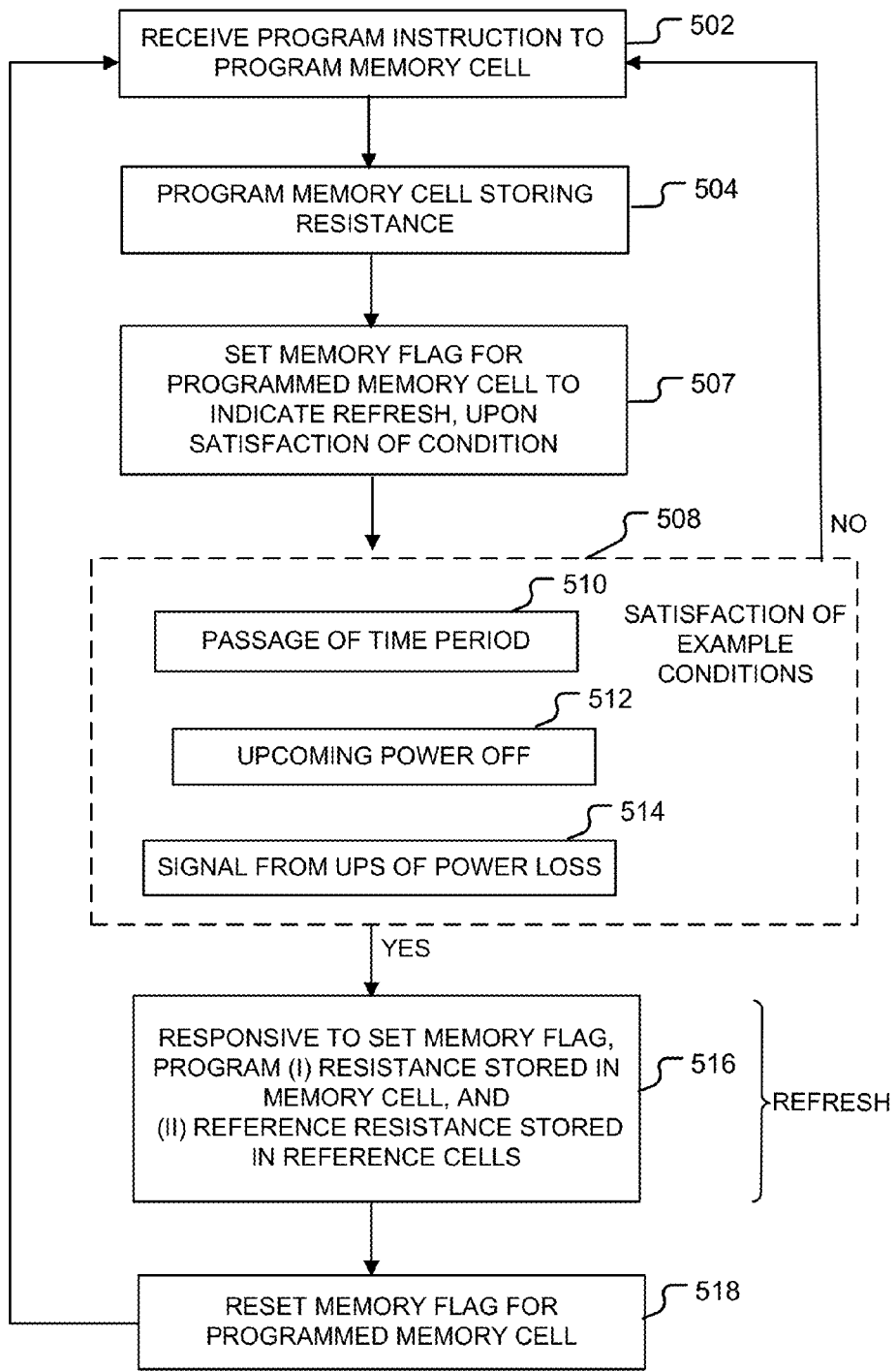
FIG. 10 is an example process flow of an integrated circuit performing refresh to counter resistance drift, with memory flags that indicate the refresh status of the memory cells and the reference cells.

FIG. 10 is an example process flow of an integrated circuit performing refresh to counter resistance drift, with memory flags that indicate the refresh status of the memory cells and the reference cells.

At 502 a program instruction is received to program a memory cell. At 504 responsive to the program instruction, the memory cell is programmed. At 507, a memory flag is set for the programmed memory cell to indicate that a future refresh to be performed, upon satisfaction of a condition. Thus, unlike FIGS. 8 and 9, the refresh is not performed as a direct consequence of the program instruction. By delaying the refresh, the instances of refresh can be decreased. Whereas FIGS. 8 and 9 may call for multiple refreshes, FIG. 10 can aggregate what would otherwise be multiple refreshes into fewer refreshes. However, maintaining the memory flags storing the refresh status can be extra overhead.

At 508, it is determined whether the condition for refresh is satisfied. Examples of satisfied conditions are passage of a time period 510, the receipt by the control circuitry of a signal caused by an upcoming power off of the integrated circuit 512, and the receipt by the control circuitry of a signal caused by a backup power supply providing power to the integrated circuit 514.

While the condition remains unsatisfied, the process loops back to 502, for other memory operations. When the condition is satisfied, the process continues to 516. At 516, responsive to the set memory flag for the programmed memory cell, the resistance stored in the memory cell is refreshed by programming. Also, the reference cells for the memory cell are refreshed by programming. As in FIGS. 8 and 9, by refreshing the reference cells, the refreshed reference cells will undergo subsequent resistance drift that tracks the memory cell programmed in response to the program instruction. However, unlike FIGS. 8 and 9, the same memory cell which was selected and programmed by the program instruction is also refreshed. This same memory cell is refreshed counteracts a time delay between the earlier time when the memory cell is selected and programmed by the program instruction, and the later time when the refresh occurs for reference cells consequent to the satisfaction of the condition. Unless the same memory cell is also refreshed, this time delay can result in different resistance drifts between the same memory cell and the refreshed reference cells. At 518, the set memory flag in memory 180 is reset, and the process loops back to 502.

This process flow can be performed for example with the integrated circuit of FIG. 3. The programmed memory cell can be in any of memory cell group 1 121 to memory cell group N 131. Responsive to receiving a program instruction to program a memory cell in memory cell group 1 121, the memory cell in memory cell group 1 121 is programmed. The memory flag in memory 180 for the memory cell in memory cell group 1 121 is set. Upon satisfaction of the condition for refresh, the memory cell in memory cell group 1 121 is refreshed by programming, and reference cells in reference cells 1 126 are refreshed by programming.

Figure 11:
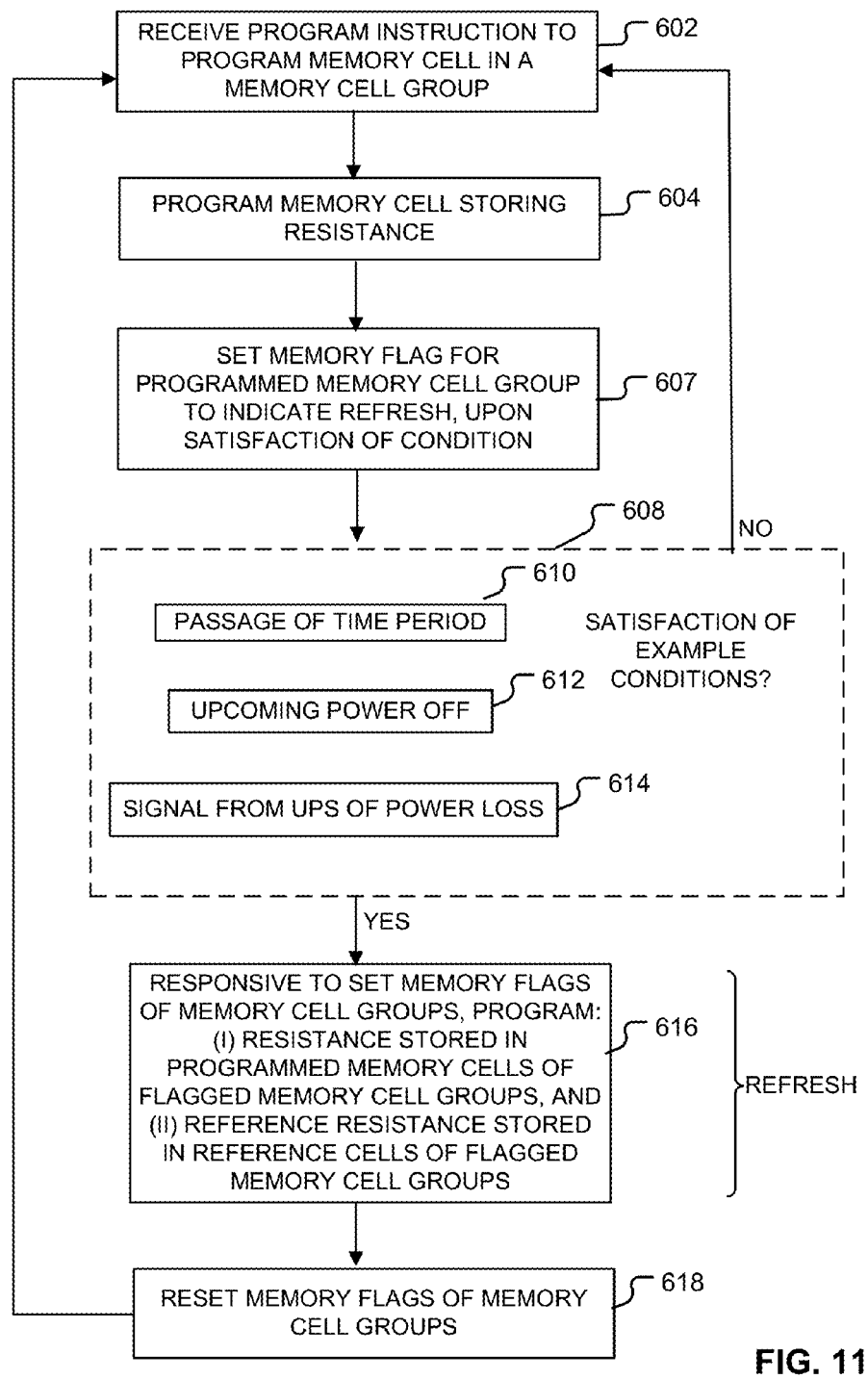
FIG. 11 is an example process flow of an integrated circuit performing refresh to counter resistance drift, with a group of memory cells that includes a memory cell selected for program, and with memory flags that indicate the refresh status of the memory cells and the reference cells.

FIG. 11 is an example process flow of an integrated circuit performing refresh to counter resistance drift, with a group of memory cells that includes a memory cell selected for program, and with memory flags that indicate the refresh status of the memory cells and the reference cells.

At 602 a program instruction is received to program a memory cell in a memory cell group. At 604 responsive to the program instruction, the memory cell in the memory cell group is programmed. At 607, a memory flag is set for the memory cell group with the programmed memory cell to indicate a future refresh to be performed, upon satisfaction of a condition. As with FIG. 10, the refresh is not performed as a direct consequence of the program instruction. By delaying the refresh, what would otherwise be multiple refreshes can be aggregated into fewer refreshes. However, maintaining the memory flags storing the refresh status can be extra overhead.

At 608, it is determined whether the condition for refresh is satisfied. Examples of satisfied conditions are passage of a time period 610, the receipt by the control circuitry of a signal caused by an upcoming power off of the integrated circuit 612, and the receipt by the control circuitry of a signal caused by a backup power supply providing power to the integrated circuit 614.

While the condition remains unsatisfied, the process loops back to 602, for other memory operations. When the condition is satisfied, the process continues to 616. At 616, responsive to the set memory flags for memory cell groups with programmed memory cells, multiple sets of cells are refreshed. In one set of refreshed cells, reference cells for the flagged groups with programmed memory cells are refreshed.

In another set of refreshed cells, programmed memory cells in the flagged groups are refreshed. These programmed memory cells may have been programmed in one or more program instructions. By refreshing these programmed memory cells, the programmed memory cells and the reference cells will undergo subsequent resistance drifts that track each other. At 618, the set memory flags in memory 180 are reset, and the process loops back to 602.

This process flow can be performed for example with the integrated circuit of FIG. 3. For example, responsive to receiving a program instruction to program a memory cell in memory cell group 1 121, the memory cell in memory cell group 1 121 is programmed.

The memory flag in memory 180 for the memory cell group 1 121 with the programmed memory cell is set. Upon satisfaction of the condition for refresh, the programmed memory cells in memory cell group 1 121 are refreshed, and reference cells in reference cells 1 126 are refreshed.

FIGS. 12 to 16 illustrate cell structures using programmable resistance memory elements which can be deployed as memory cells and reference cells.

FIGS. 12 to 15 illustrate cells based on phase change materials. Embodiments of the phase change materials include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Concentrations of Ge can range from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities, in some embodiments, to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable.

An exemplary method for forming chalcogenide material uses PVD-sputtering or magnetron-sputtering method with source gas(es) of Ar, N2, and/or He, etc., at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

Figure 12:
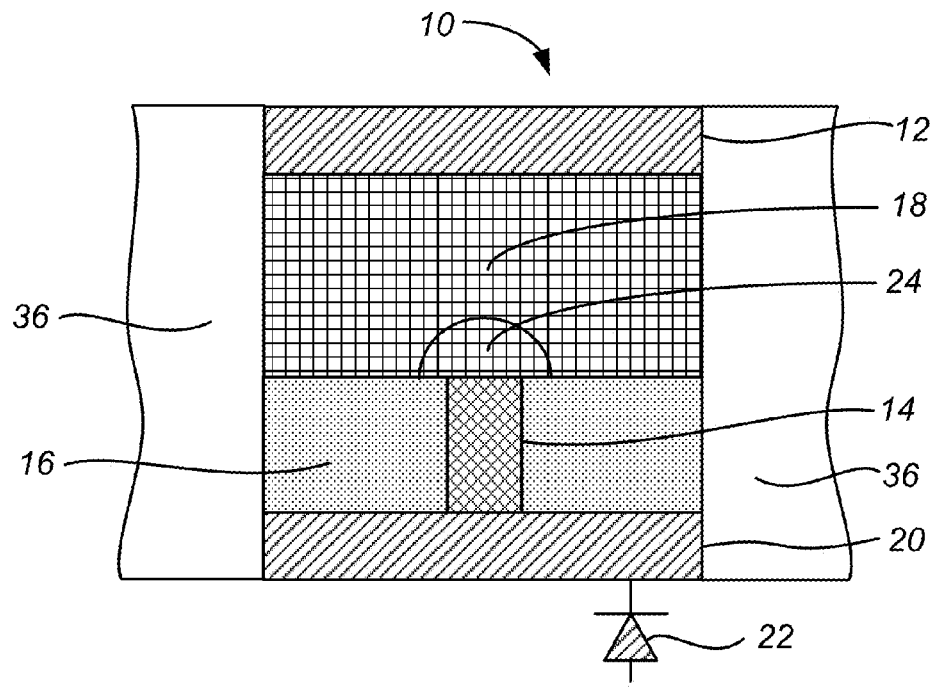
FIGS. 12-16 illustrate different types of phase change cells which can be used as the memory cells and the reference cells.

FIG. 12 illustrates a simplified cross-sectional view of a mushroom-type cell 10. Cell 10 includes a top electrode 12, which can be a bit line, a heater or bottom electrode 14, an insulator 16 surrounding the bottom electrode, phase change material 18 coupled to the top electrode 12 and the bottom electrode 14, a contact 20 coupled to the bottom electrode 14, and an access, such as a diode 22 coupled to the contact. The cell 10 in the example shown includes a phase change memory material as the programmable resistance material 18 having an active region 24 which changes phase under bias conditions applied during operation of the array. Insulating dielectric materials 36 acts as a capping layer, enclosing the cell and contacting the phase change material.

Figure 13:
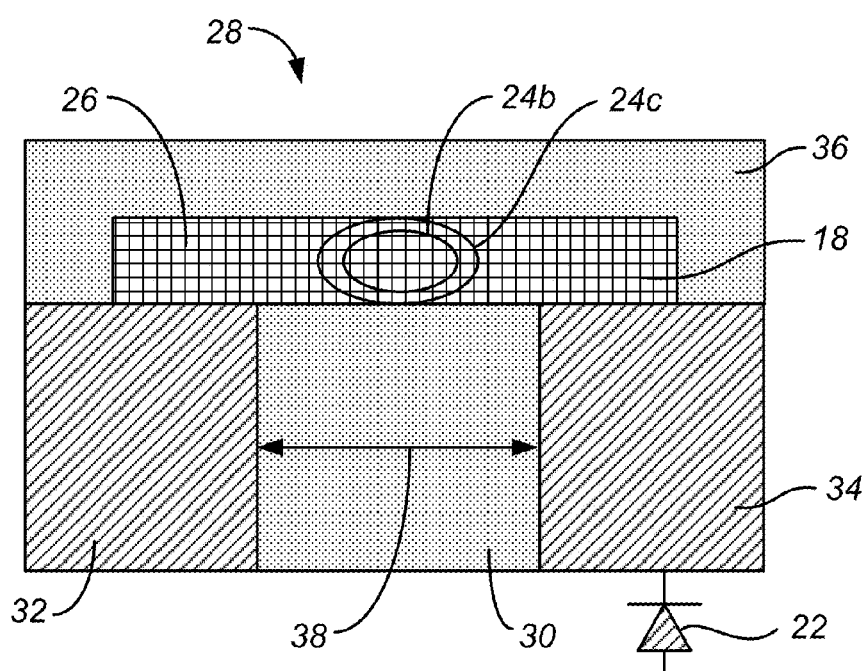

FIG. 13 illustrates a simplified cross-sectional view of a bridge-type cell 28. Cell 28 includes a dielectric spacer 30 separating first and second electrodes 32 and 34. Dielectric material 36 acts as a capping layer, and surrounds a programmable resistance memory material 18. The memory material 18 extends across the dielectric spacer 30 to contact the first and second electrodes 32, 34, thereby defining an inter-electrode current path between the first and second electrodes 32, 34 having a path length defined by the width 38 of the dielectric spacer 30. The cell 28 includes an access device 22 coupled to the second electrode 34.

Figure 14:
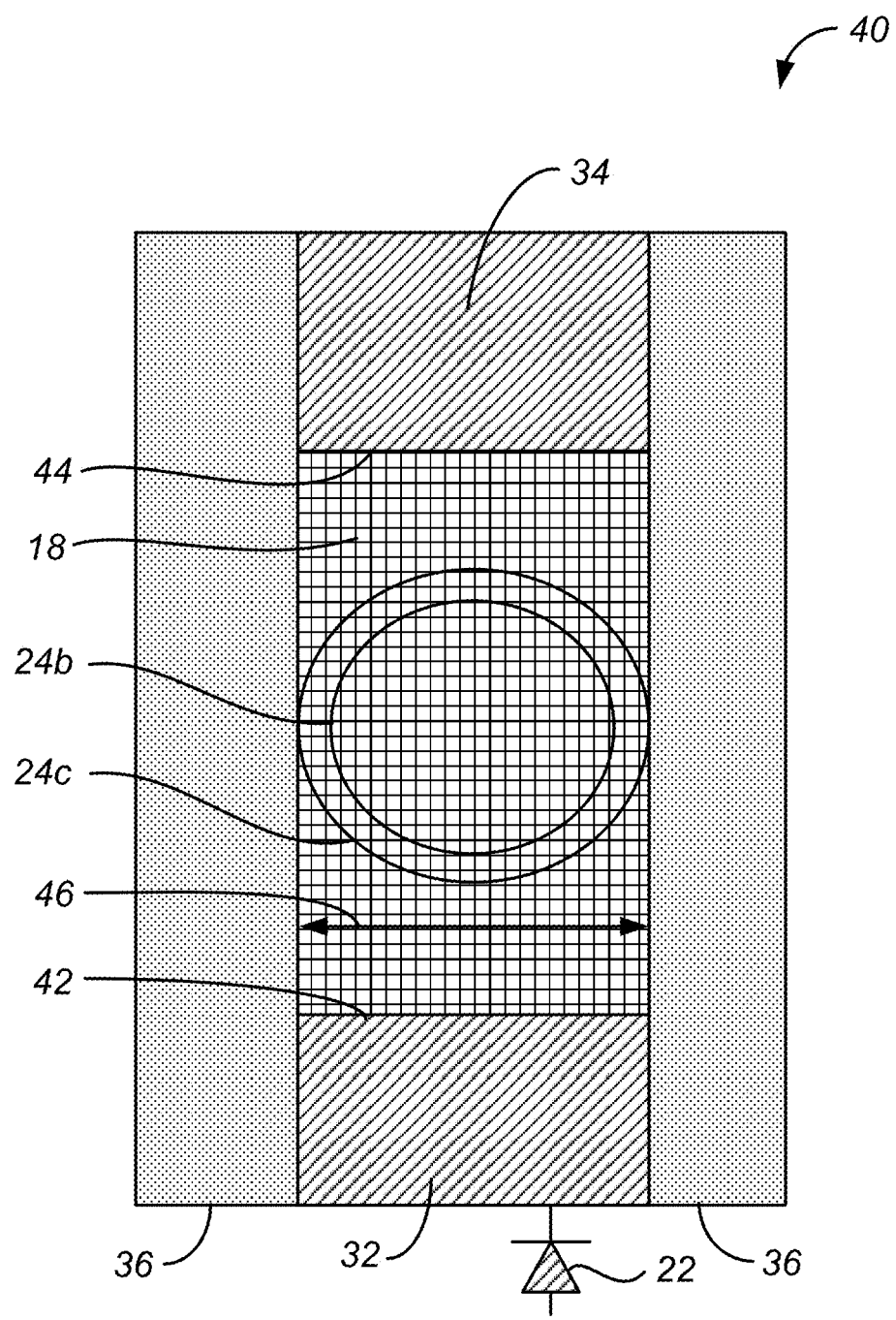

FIG. 14 illustrates a cross-sectional view of an "active-in-via" type cell 40. Cell 40 includes a memory material 18 contacting first and second electrodes 32, 34 at their top and bottom surfaces 42, 44, respectively. Dielectric material 36 surrounds the memory material 18. The memory material 18 has a width 46 substantially the same in this example, as that of the first and second electrodes 32, 34 to define a multilayer pillar surrounded by dielectric 36 acting as a capping layer. As used herein, the term "substantially" is intended to accommodate manufacturing tolerances. The cell 40 includes an access device 22, such as a diode or transistor, coupled to the electrode 32.

Figure 15:
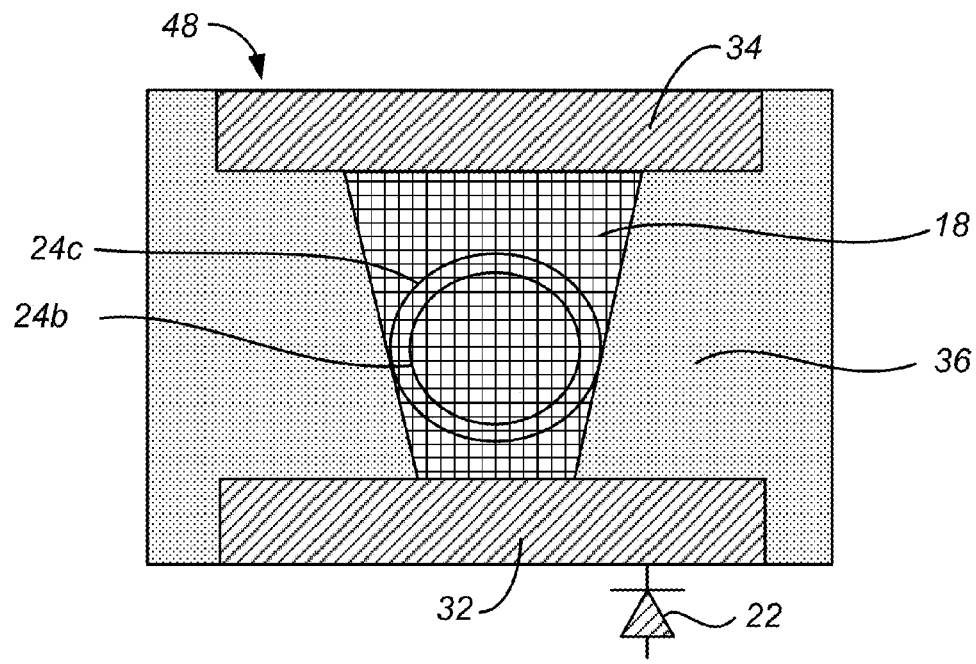

FIG. 15 illustrates a cross-sectional view of a pore-type cell 48. Cell 48 includes a memory material 18. Dielectric material 36 surrounds the memory material 18, and acts as a capping layer. The memory material 18 contacts first and second electrodes 32, 34 at top and bottom surfaces, respectively. The cell 48 includes an access device 22 such as a diode or transistor, coupled to the electrode 32.

The dielectric materials 36 which surround the phase change materials in the cells shown in FIGS. 12 to 15, may include, for example, $SiO_2$, $Si_3N_4$, $SiO_xN_y$ or $Al_2O_3$.

Figure 16:
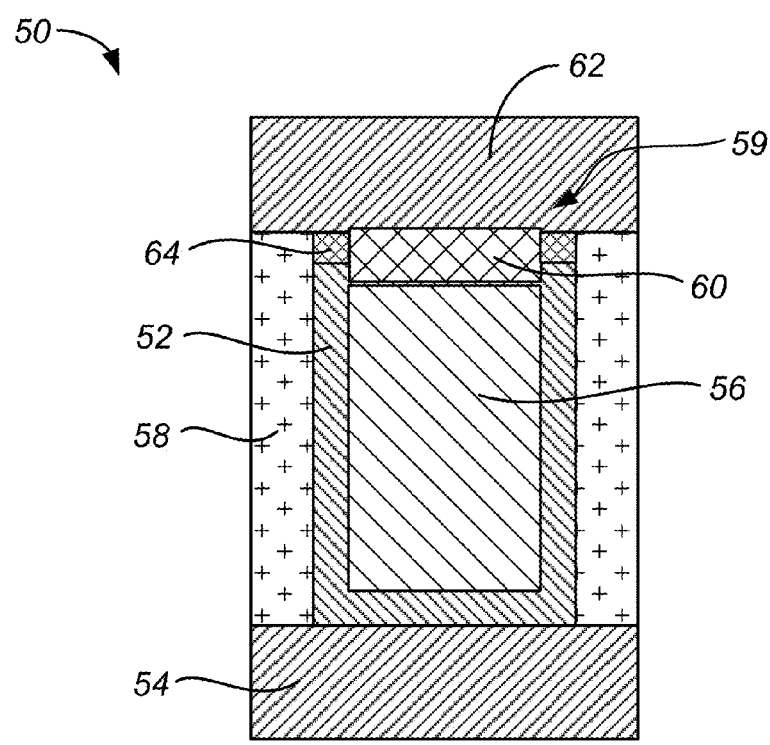

FIG. 16 illustrates a simplified cross-sectional view of a metal-oxide cell 50. The cell 50 includes a liner layer 52 between a bottom electrode 54 and a conductive element 56. The conductive element 56 is surrounded by the liner layer 52 and extends through a dielectric 58 to contact a memory element 59, memory element 59 including a metal-oxide layer 60 and a metal oxide ring 64. A top electrode 62 is on the memory element 59. As shown in FIG. 16, metal oxide ring 64 of the memory element 59 at the end of liner layer 52 induces a field enhancement effect. The dielectric 58 contacts the metal oxide ring 64 of the memory element 60, and acts as a capping layer. The top electrode 62 is an electrically conductive element which, in some embodiments, is a portion of a bit line. The top electrode 62 may comprise, for example, one or more elements selected from the group consisting of Ti, W, Yb, Tb, Y, Sc, Hf, Zr, Nb, Cr, V, Zn, Re, Co, Rh, Pd, Pt, Mo, Al, Ta, Cu, Pt, Ir, La, Ni, N, O, and Ru and combinations thereof. In some embodiments, the top electrode 62 may comprise more than one layer of material.

The bottom electrode 54 is an electrically conductive element. The bottom electrode may, for example, comprise doped polysilicon, which may be the terminal of a diode or access transistor. Alternatively, the bottom electrode 54 may comprise, for example, any of the materials discussed above with reference to the top electrode 62.

The conductive element 56 may comprise, for example, any of the materials discussed above with reference to the top electrode 62.

The metal-oxide layer 60 comprises metal-oxide material which is programmable to a plurality of resistance states. In some embodiments, metal-oxide layer 60 may comprise one or more metal oxides from the group of tungsten oxide, titanium oxide, nickel oxide, aluminum oxide, copper oxide, zirconium oxide, niobium oxide, tantalum oxide, titanium nickel oxide, Cr-doped $SrZrO_3$, Cr-doped $SrTiO_3$, PCMO and LaCaMnO. In some embodiments, the memory element 340 may comprise WO/Cu or Ag, TiO/Cu or Ag, NiO/Cu or Ag, AlO/Cu or Ag, CuO/Cu or Ag, ZrO/Cu or Ag, NbO/Cu or Ag, TaO/Cu or Ag, TiNO/Cu or Ag, Cr-doped $SrZrO_3$/Cu or Ag, Cr-doped $SrTiO_3$/Cu or Ag, PCMO/CU or Ag, LaCaMnO/Cu or Ag, and $SiO_2$/Cu or Ag.

The liner layer 52 may comprise, for example, a layer of TiN or a bi-layer of silicon nitride and TiN. Other materials can be used for the liner layer 52 as well.

As shown in FIG. 16, the metal-oxide ring 64 surrounds the metal-oxide layer 60 at the level at which contact to the top electrode 62 is made. The metal-oxide ring 64 may, for example, comprise $TiNO_x$, $SiO_2$, $HfO_x$, $TiNO_x$, $TiO_x$, $AlO_x$, $WO_x$, etc., and is preferably chosen so that the material of the metal-oxide ring 64 has a higher resistance than that of central portion of the memory element 59, that is metal-oxide layer 60.

In the illustrated embodiment the conductive element 56 comprises tungsten, the metal-oxide layer 60 of tungsten oxide, the metal-oxide ring 64 of $TiNO_x$, and the liner layer 52 comprises TiN or a bi-layer of silicon nitride and TiN.

In addition to the cells, such as phase change cells and metal oxide cells described as above, solid state electrolyte (conductive bridge) memory cells and magnetoresistive memory cells, spin transfer torque material, and magnetic material, can be applicable to the present technology.

Figure 17:
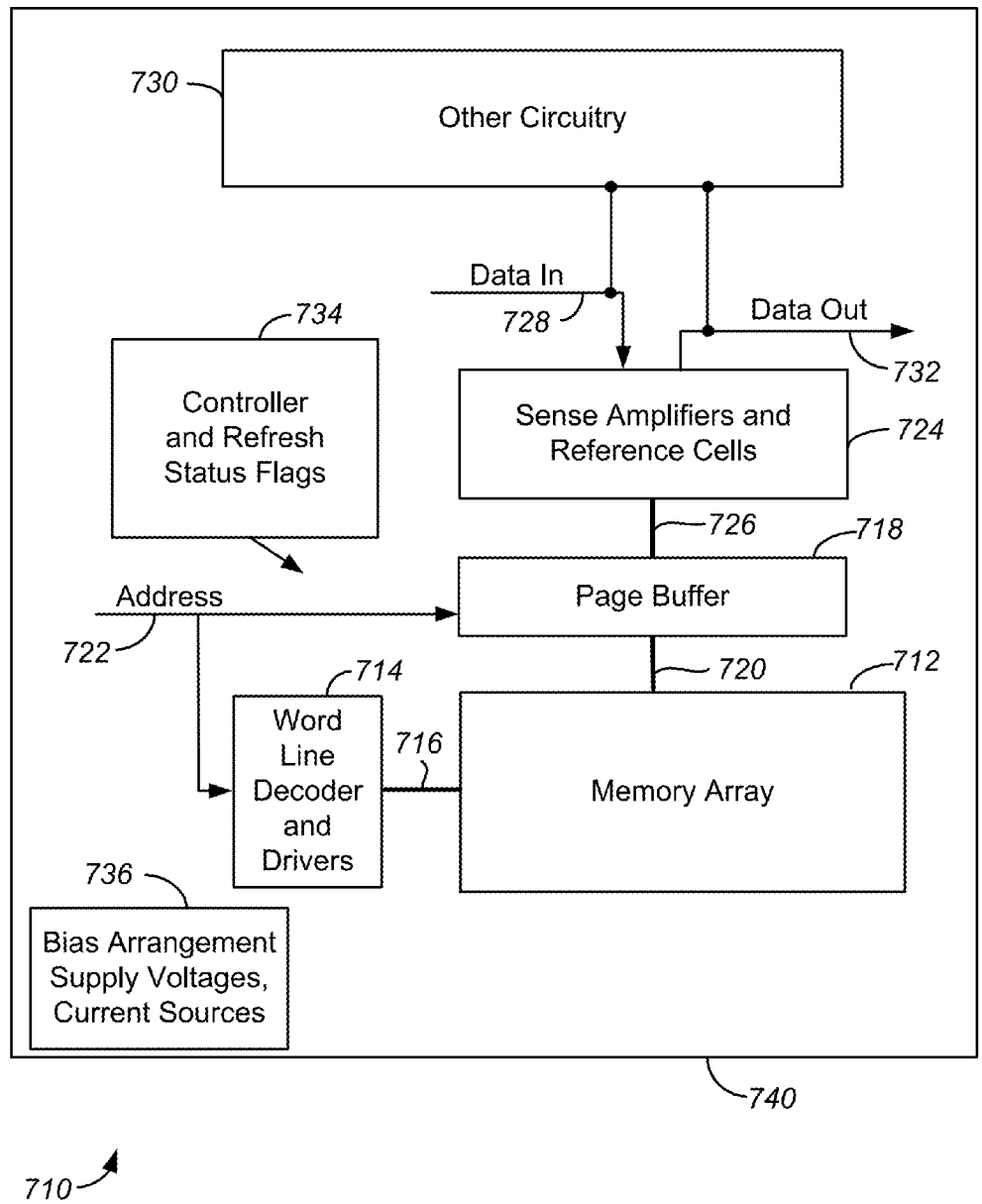
FIG. 17 is a block diagram of an integrated circuit including the memory cells and reference cells.

FIG. 17 is a block diagram of an example of an integrated circuit 710 including a memory array 712. Memory array 712 includes a memory array of memory cells. A reference array of reference cells can be part of the memory array or a separate array. A word line decoder 714 is coupled to and in electrical communication with a plurality of word lines 716 arranged along rows in the memory array 712. A page buffer 718 is in electrical communication with a plurality of bit lines 720 arranged along columns in the array 712 for reading, setting, and resetting the memory cells in memory array 712. Addresses are supplied on bus 722 to word line decoder and drivers 714 and page buffer 718. Sense amplifiers, reference cells, and data-in structures in block 724, including voltage and/or current sources for read, set, and reset modes are coupled to page buffer 718 via data bus 726. Data is supplied via a data-in line 728 from input/output ports on integrated circuit 710, or from other data sources internal or external to integrated circuit 710, to data-in structures in block 724. Other circuitry 730 may be included on integrated circuit 710, such as a general purpose processor or special purpose application circuitry, or a combination of modules providing system-on-a-chip functionality supported by array 712. Data is supplied via a data-out line 732 from the sense amplifiers in block 724 to input/output ports on integrated circuit 710, or to other data destinations internal or external to integrated circuit 710.

A controller 734 implemented in this example, using a bias arrangement state machine, controls the application of bias arrangement supply voltages and current sources 736, such as read, set, reset and verify voltages and/or currents. The controller 734 controls the application the bias arrangement supply voltages and current sources 736 to program and refresh the memory cells in the memory array 712 and the reference cells 724. Controller 734 can also include refresh status flags to indicate whether particular groups of memory and reference cells are to be refreshed upon satisfaction of a condition. Controller 734 may be implemented using special-purpose logic circuitry as known in the art. In alternative embodiments, controller 734 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 734.

In an embodiment the controller 734 performs:
programming a first memory cell to have a first resistance;
upon programming the first memory cell, updating a refresh status of the first memory cell stored in a memory to indicate that the first resistance of the first memory cell and a first reference resistance of a first reference cell are to be refreshed upon satisfaction of a condition, wherein the first memory cell and the first reference cell are electrically coupleable via sense amplifier circuitry.

In an embodiment the controller 734 performs:
programming a first memory cell to have a first resistance;
upon programming the first memory cell, programming a first reference cell to have a first reference resistance, wherein the first memory cell and the first reference cell are electrically coupleable via sense amplifier circuitry.

In an embodiment the controller 734 performs:
programming one or more memory cells in a first group of memory cells in the plurality of groups of memory cells, the one or more memory cells having respective resistances;
upon programming the one or more memory cells in the first group of memory cells, programming a set of reference cells in a plurality of sets of reference cells having reference resistances, wherein different sets of reference cells in the plurality of sets of reference cells are electrically coupleable to different groups of memory cells in the plurality of groups of memory cells via a respective sense amplifier in a plurality of sense amplifiers.

In an embodiment the controller 734 performs:
upon programming the one or more memory cells in the first group of memory cells, also programming one or more other programmed memory cells in the first group of memory cells.

In an embodiment the controller 734 performs:
programming one or more memory cells in a first group of memory cells in the plurality of groups of memory cells to have respective resistances;
upon programming the one or more memory cells in the first group of memory cells, updating a respective one of a plurality of refresh statuses stored in a memory to indicate that the resistances of the first group of memory cells and reference resistances of a set of reference cells in a plurality of sets of reference cells are to be refreshed upon satisfaction of a condition, the set of reference cells in the plurality of sets of reference cells coupled to the first group of memory cells via a respective sense amplifier in a plurality of sense amplifiers.

Any and all patents, patent applications and printed publications referred to above are incorporated by reference.

The above descriptions may have used terms such as above, below, top, bottom, over, under, etc. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a first memory cell having a first resistance;
sense amplifier circuitry including a first reference cell having a first reference resistance;
a memory storing a refresh status of the first reference cell, the refresh status including a first state and a second state; and
control circuitry that executes a refresh operation upon satisfaction of a condition, the refresh operation including refreshing the first reference cell and the first memory cell if the refresh status of the first reference cell is the first state, and not refreshing the first reference cell and the first memory cell if the refresh status is the second state, and that upon programming the first memory cell, updates the refresh status stored in the memory to the first state.

2. The integrated circuit of claim 1, the control circuitry including logic that, if the first memory cell and the first reference cell are refreshed in the refresh operation, updates the refresh status of the first reference cell stored in the memory to the second state.

3. The integrated circuit of claim 1, wherein the condition is passage of a time period.

4. The integrated circuit of claim 1, wherein the condition is receipt by the control circuitry of a signal caused by an upcoming power off of the integrated circuit.

5. The integrated circuit of claim 1, wherein the condition is receipt by the control circuitry of a signal caused by a backup power supply providing power to the integrated circuit.

6. The integrated circuit of claim 1, wherein the first memory cell and the first reference cell share a same cell structure.

7. The integrated circuit of claim 1, wherein the first memory cell and the first reference cell comprise programmable resistance material.

8. The integrated circuit of claim 1, wherein the first resistance represents multiple bits, the first reference cell is one of a plurality of reference cells storing different reference resistances, the sense amplifier circuitry compares the first resistance to the different reference resistances to determine the multiple bits represented by the first resistance, and the plurality of reference cells are to be refreshed upon satisfaction of the condition.

9. The integrated circuit of claim 1, wherein (i) the first memory cell having the first resistance, and (ii) the memory storing a refresh status of the first reference cell, are in separate arrays.

10. The integrated circuit of claim 1, wherein the first memory cell and the first reference cell share a same memory array.

11. The integrated circuit of claim 1, comprising a plurality of memory cell groups, and wherein the first memory cell is in one of the groups and the first reference cell and sense amplifier are coupled by decoding circuits to said one of the groups.

12. The integrated circuit of claim 1, wherein:
the first resistance represents multiple bits;
the first reference cell is one of a plurality of reference cells representing different reference resistances;
the sense amplifier circuitry compares the first resistance to the different reference resistances to determine the multiple bits represented by the first resistance; and
the control circuitry programs the first memory cell upon receiving a program instruction of the first memory cell.

13. An integrated circuit, comprising:
an array of memory cells including a plurality of groups of memory cells having resistances;
a plurality of sense amplifiers including a plurality of sets of reference cells having reference resistances, sets of reference cells in the plurality of sets of reference cells corresponding to different groups of memory cells in the plurality of groups of memory cells via sense amplifiers in the plurality of sense amplifiers;
a memory storing refresh statuses of the plurality of groups of memory cells, the refresh status of a group in the plurality of groups including a first state and a second state; and
control circuitry that executes a refresh operation upon satisfaction of a condition, the refresh operation including refreshing at least one memory cell in a particular group of memory cells and the set of reference cells corresponding to the particular group if the refresh status of the particular group is the first state, and not refreshing the particular group of memory cells and its corresponding set of reference cells if the refresh status of the particular group is the second state, and that, upon programming one or more memory cells in a first group of memory cells in the plurality of groups of memory cells, updates the refresh status of the first group stored in the memory to the first state.

14. The integrated circuit of claim 13, wherein the control circuitry including logic that, for groups of memory cells and corresponding sets of reference cells that are refreshed in the refresh operation, updates the refresh statuses stored in the memory of the refreshed groups of memory cells to the second state.

\* \* \* \* \*